(12) United States Patent
Sanders (10) Patent No.: US 7,742,514 B1
(45) Date of Patent: Jun. 22, 2010

(54) LASER NAVIGATION SENSOR

(75) Inventor: Steven Sanders, Belmont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/591,015

(22) Filed: Oct. 31, 2006

(51) Int. Cl.
*H01S 3/00* (2006.01)

(52) U.S. Cl. ............... 372/38.02; 372/38.07; 372/38.01

(58) Field of Classification Search ............... 372/38.02, 372/38.01, 38.07
See application file for complete search history.

(56) References Cited

U.S. PATENT DOCUMENTS

| | | | |
|---|---|---|---|
| 3,922,093 A | 11/1975 | Dandliker et al. |
| 4,225,240 A | 9/1980 | Balasubramanian |
| 4,546,347 A | 10/1985 | Kirsch |
| 4,740,675 A | 4/1988 | Brosnan et al. |
| 4,751,380 A | 6/1988 | Victor et al. |
| 4,799,055 A | 1/1989 | Nestler et al. |
| 4,814,553 A | 3/1989 | Joyce |
| 4,920,260 A | 4/1990 | Victor et al. |
| 4,936,683 A | 6/1990 | Purcell |
| 5,052,027 A | 9/1991 | Poklemba et al. |
| 5,288,993 A | 2/1994 | Bidiville et al. |
| 5,345,527 A | 9/1994 | Lebby et al. |
| 5,391,868 A | 2/1995 | Vampola et al. |
| 5,448,508 A | 9/1995 | Ono et al. |
| 5,473,344 A | 12/1995 | Bacon et al. |
| 5,578,813 A | 11/1996 | Allen et al. |
| 5,606,174 A | 2/1997 | Yoshimura et al. |
| 5,644,139 A | 7/1997 | Allen et al. |
| D382,550 S | 8/1997 | Kaneko et al. |
| D385,542 S | 10/1997 | Kaneko et al. |
| 5,703,356 A | 12/1997 | Bidiville et al. |
| 5,729,008 A | 3/1998 | Blalock et al. |
| 5,729,009 A | 3/1998 | Dandliker et al. |
| 5,781,229 A | 7/1998 | Zediker et al. |
| 5,786,804 A | 7/1998 | Gordon |
| 5,825,044 A | 10/1998 | Allen et al. |
| 5,854,482 A | 12/1998 | Bidiville et al. |
| 5,907,152 A | 5/1999 | Dandliker et al. |
| 5,963,197 A | 10/1999 | Bacon et al. |
| 5,994,710 A | 11/1999 | Knee et al. |
| 6,031,218 A | 2/2000 | Piot et al. |
| 6,034,379 A | 3/2000 | Bunte et al. |
| 6,037,643 A | 3/2000 | Knee |
| 6,057,540 A | 5/2000 | Gordon et al. |
| 6,097,371 A | 8/2000 | Siddiqui et al. |
| 6,137,566 A | 10/2000 | Leonard et al. |

(Continued)

OTHER PUBLICATIONS

USPTO Miscellaneous Action for U.S. Appl. No. 11/123,525 dated Jun. 10, 2005; 1 page.

(Continued)

*Primary Examiner*—Minsun Harvey
*Assistant Examiner*—Patrick Stafford (57) ABSTRACT

The apparatus includes a diode laser, a current source interconnected with the diode laser, and four limiting circuits. The first limiting circuit limits peak current flowing to an anode connection of the diode laser. The second limiting circuit limits peak current flowing from a cathode connection of the diode laser, wherein the first and second limiting circuits are independent from each other. The third limiting circuit limits average current flowing through the diode laser. Finally, the fourth limiting circuit limits average current flowing through the diode laser, wherein the third and fourth limiting circuits are independent from each other. Other embodiments and features are also disclosed.

20 Claims, 7 Drawing Sheets

U.S. PATENT DOCUMENTS

| | | | |
|---|---|---|---|
| 6,151,015 A | 11/2000 | Badyal et al. |
| 6,172,354 B1 | 1/2001 | Adan et al. |
| 6,194,695 B1 | 2/2001 | Barrows |
| 6,201,572 B1 | 3/2001 | Chou |
| 6,225,617 B1 | 5/2001 | Dandliker et al. |
| 6,233,368 B1 | 5/2001 | Badyal et al. |
| 6,243,134 B1 | 6/2001 | Beiley |
| 6,256,016 B1 | 7/2001 | Piot et al. |
| 6,281,881 B1 | 8/2001 | Siddiqui et al. |
| 6,281,882 B1 | 8/2001 | Gordon et al. |
| 6,326,950 B1 | 12/2001 | Liu |
| 6,330,057 B1 | 12/2001 | Lederer et al. |
| 6,351,257 B1 | 2/2002 | Liu |
| 6,396,479 B2 | 5/2002 | Gordon |
| 6,421,045 B1 | 7/2002 | Venkat et al. |
| 6,424,407 B1 | 7/2002 | Kinrot et al. |
| 6,433,780 B1 | 8/2002 | Gordon et al. |
| 6,452,683 B1 | 9/2002 | Kinrot et al. |
| 6,455,840 B1 | 9/2002 | Oliver et al. |
| D464,352 S | 10/2002 | Kerestegian |
| 6,462,330 B1 | 10/2002 | Venkat et al. |
| 6,476,970 B1 | 11/2002 | Smith |
| 6,529,184 B1 | 3/2003 | Julienne |
| 6,585,158 B2 | 7/2003 | Norskog |
| 6,603,111 B2 | 8/2003 | Dietz et al. |
| 6,608,585 B2 | 8/2003 | Benitz |
| 6,618,038 B1 | 9/2003 | Bohn |
| 6,621,483 B2 | 9/2003 | Wallace et al. |
| 6,642,506 B1 | 11/2003 | Nahum et al. |
| 6,657,184 B2 | 12/2003 | Anderson et al. |
| 6,664,948 B2 | 12/2003 | Crane et al. |
| 6,674,475 B1 | 1/2004 | Anderson |
| 6,677,929 B2 | 1/2004 | Gordon et al. |
| 6,703,599 B1 | 3/2004 | Casebolt et al. |
| 6,737,636 B2 | 5/2004 | Dietz et al. |
| 6,741,335 B2 | 5/2004 | Kinrot et al. |
| 6,753,851 B2 | 6/2004 | Choi et al. |
| 6,774,351 B2 | 8/2004 | Black |
| 6,774,915 B2 | 8/2004 | Rensberger |
| 6,778,571 B2 | 8/2004 | Vaughan |
| 6,792,020 B2 * | 9/2004 | Romm | 372/38.09 |
| 6,795,056 B2 | 9/2004 | Norskog et al. |
| 6,809,403 B2 | 10/2004 | Gee |
| 6,809,723 B2 | 10/2004 | Davis |
| 6,819,314 B2 | 11/2004 | Black |
| 6,823,077 B2 | 11/2004 | Dietz et al. |
| 6,950,094 B2 | 9/2005 | Gordon et al. |
| 6,967,321 B2 | 11/2005 | Leong et al. |
| 6,977,645 B2 | 12/2005 | Brosnan |
| 7,019,733 B2 | 3/2006 | Koay |
| 7,042,575 B2 | 5/2006 | Carlisle et al. |
| 7,049,578 B2 | 5/2006 | Wada et al. |
| 7,119,323 B1 | 10/2006 | Brosnan et al. |
| 7,126,585 B2 | 10/2006 | Davis et al. |
| 7,138,620 B2 | 11/2006 | Trisnadi et al. |
| 7,148,078 B2 | 12/2006 | Moyer et al. |
| 7,161,682 B2 | 1/2007 | Xie et al. |
| 7,205,521 B2 | 4/2007 | Gruhlke et al. |
| 7,253,837 B2 | 8/2007 | Henderson et al. |
| 7,279,668 B2 | 10/2007 | Misek |
| 7,280,140 B2 | 10/2007 | Henderson |
| 7,321,359 B2 | 1/2008 | Xie et al. |
| 7,439,954 B2 | 10/2008 | Theytaz et al. |
| 7,443,427 B2 | 10/2008 | Takayanagi |
| 7,460,979 B2 | 12/2008 | Buckner |
| 7,492,351 B2 | 2/2009 | VanWiggeren et al. |
| 2002/0093487 A1 | 7/2002 | Rosenberg |
| 2002/0130835 A1 | 9/2002 | Brosnan |
| 2002/0158300 A1 | 10/2002 | Gee |
| 2002/0190953 A1 | 12/2002 | Gordon et al. |
| 2003/0034959 A1 | 2/2003 | Davis et al. |
| 2003/0058506 A1 | 3/2003 | Green et al. |
| 2003/0142288 A1 | 7/2003 | Kinrot et al. |
| 2003/0171009 A1 * | 9/2003 | Mercier | 439/49 |
| 2003/0231853 A1 * | 12/2003 | Sato et al. | 385/147 |
| 2004/0084610 A1 | 5/2004 | Leong et al. |
| 2004/0165629 A1 * | 8/2004 | Iwakura | 372/38.02 |
| 2004/0189593 A1 | 9/2004 | Koay |
| 2005/0024336 A1 | 2/2005 | Xie et al. |
| 2005/0024623 A1 | 2/2005 | Xie et al. |
| 2005/0083303 A1 | 4/2005 | Schroeder et al. |
| 2005/0258346 A1 | 11/2005 | LeHoty et al. |
| 2005/0259078 A1 | 11/2005 | Roxlo et al. |
| 2005/0259097 A1 | 11/2005 | LeHoty et al. |
| 2005/0285960 A1 | 12/2005 | Purcell et al. |
| 2006/0028442 A1 | 2/2006 | Bynum et al. |

OTHER PUBLICATIONS

USPTO Non-Final Rejection for U.S. Appl. No. 11/123,525 dated Apr. 14, 2008; 20 pages.

International Search Report of the International Searching Authority for Application No. PCT/US2005/017375 dated Oct. 2, 2006; 2 pages.

USPTO Notice of Allowance for U.S. Appl. No. 11/123,326 dated Jul. 7, 2007; 4 pages.

USPTO Non-Final Rejection for U.S. Appl. No. 11/123,326 dated Mar. 21, 2007; 6 pages.

USPTO Miscellaneous Action for U.S. Appl. No. 11/123,326 dated Jun. 8, 2005; 1 page.

R.E. Kalman, "A New Approach to Linear Filtering and Prediction Problems," Transactions of the ASME-Journal of Basic Engineering, Copyright 1960, Research Institute for Advanced Study; Baltimore, MD; 12 pages.

USPTO Non-Final Rejection for U.S. Appl. No. 11/123,500 dated Apr. 11, 2005; 17 pages.

USPTO Miscellaneous Action for U.S. Appl. No. 11/123,500 dated Jun. 8, 2005; 1 page.

"The Examiners Grounds for Rejection" from Korean Patent Office for Patent Application No. 10-2006-7026956; Dec. 31, 2007, 4 pages.

International Search Report of the International Searching Authority for International Application No. PCT/US2005/017459 dated Sep. 26, 2006, 2 pages.

The Written Opinion of the International Searching Authority for International Application No. PCT/US2005/017459 dated Sep. 26, 2006, 2 pages.

USPTO Notice of Allowance for U.S. Appl. No. 11/128,988 dated Feb. 2, 2006; 7 pages.

USPTO Non-Final Rejection for U.S. Appl. No. 11/123,527 dated Apr. 9, 2008; 18 pages.

International Search Report of the International Searching Authority for International Application No. PCT/US2005/017461 dated Nov. 23, 2006; 3 pages.

USPTO Notice of Allowance for U.S. Appl. No. 11/261,316 dated Aug. 23, 2005; 6 pages.

USPTO Non-Final Rejection for U.S. Appl. No. 11/261,316 dated Jun. 6, 2006; 6 pages.

USPTO Notice of Allowance for U.S. Appl. No. 11/582,776 dated May 16, 2008; 6 pages.

USPTO Non-Final Rejection for U.S. Appl. No. 11/582,776 dated Sep. 10, 2007; 8 pages.

USPTO Notice of Allowance for U.S. Appl. No. 11/292,470 dated May 30, 2008; 7 pages.

USPTO Final Rejection for U.S. Appl. No. 11/292,470 dated Sep. 19, 2007; 10 pages.

USPTO Non-Final Rejection for U.S. Appl. No. 11/292,470 dated Jan. 17, 2007; 12 pages.

USPTO Notice of Allowance for U.S. Appl. No. 11/268,898 dated Apr. 19, 2007; 9 pages.

USPTO Final Rejection for U.S. Appl. No. 11/303,365 dated Jan. 2, 2008; 11 pages.

USPTO Non-Final Rejection for U.S. Appl. No. 11/303,365 dated Apr. 2, 2007; 13 pages.

USPTO Notice of Allowance for U.S. Appl. No. 11/271,039 dated Jun. 5, 2007; 7 pages.
USPTO Final Rejection for U.S. Appl. No. 11/271,039 dated Mar. 16, 2007; 8 pages.
USPTO Non-Final Rejection for U.S. Appl. No. 11/271,039 dated Aug. 8, 2006 7 pages.
USPTO Notice of Allowance for U.S. Appl. No. 11/223,389 dated Apr. 26, 2007; 7 pages.
USPTO Final Rejection for U.S. Appl. No. 11/223,389 dated Mar. 5, 2007; 5 pages.
USPTO Non-Final Rejection for U.S. Appl. No. 11/223,389 dated Jun. 26, 2006; 12 pages.
USPTO Notice of Allowance for U.S. Appl. No. 11/303,363 dated Sep. 17, 2009; 4 pages.
USPTO Non-Final Rejection for U.S. Appl. No. 11/303,363 dated Apr. 16, 2009; 4 pages.
USPTO Notice of Allowance for U.S. Appl. No. 11/324,424 dated Oct. 2, 2007; 4 pages.
USPTO Non-Final Rejection for U.S. Appl. No. 11/324,424 dated Apr. 12, 2007; 6 pages.
USPTO Notice of Allowance for U.S. Appl. No. 11/389,903 dated Sep. 19, 2007; 7 pages.
USPTO Non-Final Rejection for U.S. Appl. No. 11/432,987 dated Sep. 3, 2009; 10 pages.
USPTO Advisory Action for U.S. Appl. No. 11/432,987 dated Jul. 22, 2009; 3 pages.
USPTO Final Rejection for U.S. Appl. No. 11/432,987 dated May 6, 2009; 8 pages.
USPTO Non-Final Rejection for U.S. Appl. No. 11/432,987 dated Oct. 20, 2008; 10 pages.
USPTO Final Rejection for U.S. Appl. No. 11/432,987 dated May 13, 2008; 8 pages.
USPTO Non-Final Rejection for U.S. Appl. No. 11/432,987 dated Nov. 5, 2007; 7 pages.
International Written Opinion of the International Searching Authority for International Application No. PCT/US2007/007062, dated Nov. 21, 2008; 5 pages.
Search Report of the International Searching Authority for International Application No. PCT/US2007/007062 dated Nov. 21, 2008; 2 pages.

* cited by examiner

LASER NAVIGATION SENSOR

TECHNICAL FIELD

The present invention relates generally to optical navigation sensors.

BACKGROUND OF THE INVENTION

Pointing devices, such as computer mice or trackballs, are utilized for inputting data into and interfacing with personal computers and workstations. Such devices allow rapid relocation of a cursor on a monitor, and are useful in many text, database and graphical programs. A user controls the cursor, for example, by moving the mouse over a surface to move the cursor in a direction and over distance proportional to the movement of the mouse. Alternatively, movement of the hand over a stationary device may be used for the same purpose.

Computer mice come in both optical and mechanical versions. Mechanical mice typically use a rotating ball to detect motion, and a pair of shaft encoders in contact with the ball to produce a digital signal used by the computer to move the cursor. One problem with mechanical mice is that they are prone to inaccuracy and malfunction after sustained use due to dirt accumulation, and such. In addition, the movement and resultant wear of the mechanical elements, particularly the shaft encoders, necessarily limit the useful life of the device.

One solution to the above-discussed with mechanical mice problems has been the development of optical mice. Optical mice have become very popular because they are more robust and may provide a better pointing accuracy.

One approach used for optical mice relies on a light emitting diode (LED) illuminating a surface at or near grazing incidence, a two-dimensional CMOS (complementary metal-oxide-semiconductor) detector which captures the resultant images, and software that correlates successive images to determine the direction, distance and speed the mouse has been moved. This technology typically provides high accuracy but suffers from a complex design and relatively high image processing requirements. In addition, the optical efficiency is low due to the grazing incidence of the illumination.

Another approach differs from the standard technology in that it uses a coherent light source, such as a laser. Light from a coherent source scattered off of a rough surface generates a random intensity distribution of light known as speckle. Such an optical navigation sensor which utilizes a laser may be referred to as a laser navigation sensor.

It is highly desirable to improve laser navigation sensors. In particular, it is highly desirable to improve techniques for ensuring eye safety for users operating laser navigation sensors.

SUMMARY

One embodiment relates to an optical navigation apparatus which provides peak and time-averaged laser output power. The apparatus includes a diode laser, a current source interconnected with the diode laser, and four limiting circuits. The first limiting circuit limits peak current flowing to an anode connection of the diode laser. The second limiting circuit limits peak current flowing from a cathode connection of the diode laser, wherein the first and second limiting circuits are independent from each other. The third limiting circuit limits average current flowing through the diode laser. Finally, the fourth limiting circuit limits average current flowing through the diode laser, wherein the third and fourth limiting circuits are independent from each other.

Another embodiment pertains to an integrated circuit configured to provide fault-tolerant limitation of time-averaged laser output power in an optical navigation apparatus. The integrated circuit includes a first limiting circuit in the current source for limiting average current flowing through the diode laser. The integrated circuit further includes a second limiting circuit in the current source for limiting average current flowing through the diode laser, wherein the second limiting circuit is independent from the first limiting circuit.

Other embodiments and features are also disclosed.

BRIEF DESCRIPTION OF THE DRAWINGS

These and various other features and advantages of the present disclosure are understood more fully from the detailed description that follows and from the accompanying drawings, which, however, should not be taken to limit the appended claims to the specific embodiments shown, but are for explanation and understanding only.

DETAILED DESCRIPTION

Laser navigation sensors, such as optical laser mouse devices, are generally required to maintain their laser output at eye-safe levels under specific operating conditions and also under single-fault conditions.

Existing approaches for maintaining laser output at eye-safe levels generally require the use of external components and calibration by the mouse manufacturer.

The present application discloses advantageous methods and apparatus for limiting laser output power to maintain eye-safe operation. The methods and apparatus may be implemented in consumer product applications, including optical laser mouse devices.

The methods and apparatus disclosed herein advantageously require no external components and allow the mouse device manufacturer to build the optical sensor into the optical mouse device and ensure eye-safe operation without additional calibration.

Fault-Tolerant Limitation of Peak Optical Power

Figure 1:
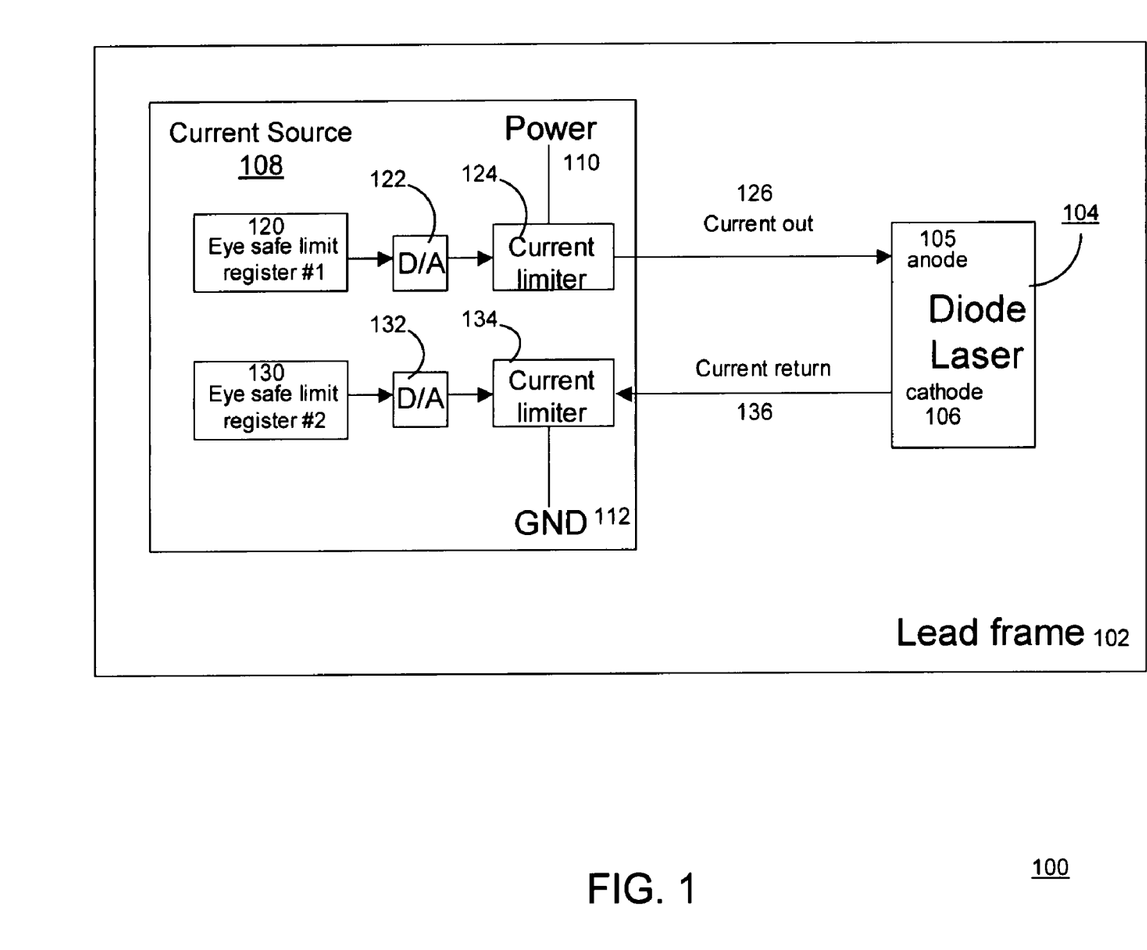
FIG. 1 is a schematic diagram showing an apparatus for fault-tolerant limitation of peak laser output power to maintain eye-safe operation of a laser navigation sensor in accordance with an embodiment of the invention.

FIG. 1 is a schematic diagram showing an apparatus 100 for fault-tolerant limitation of peak laser output power to maintain eye-safe operation of a laser navigation sensor in accordance with an embodiment of the invention. The apparatus 100 may include a lead frame 102. The lead frame may contain a diode laser 104 current source 108 on a silicon die. The diode laser 104 may comprise, for example, a vertical cavity surface emitting laser (VCSEL). Bond wires (126 and 136) may be configured so as to attach and interconnect the current source output 124 and return 134 to the diode laser anode 105 and cathode 106, respectively.

In accordance with an embodiment of the invention, the current source 108 may be configured with two independent means for limiting the electrical current flowing out of the current source and back into the current source. These two independent means include two independent current limiter circuits 124 and 134.

A first current limiter circuit 124 is configured to limit the electrical current flowing out of the current source. Electrical current flows from a power source 110 through the first current limiter circuit 124 to the laser anode 105.

A first eye-safe limit register (register #1) 120 is a memory register which is programmed to hold a digital value. The digital value therein corresponds to a first current limit (i.e. a first maximum current) which is imposed by the first current limiter circuit 124. The digital value from register #1 120 is transformed into an analog control voltage by a first digital-to-analog (D/A) converter circuit 122. This analog control voltage is used to control the first current limiter circuit 124 so as to impose the first current limit. The current output via the output bond wire 126 from the first current limiter 124 to the anode 105 of the diode laser 104 does not exceed this first current limit.

A second current limiter circuit 134 is configured to limit the electrical current returning to the current source. Electrical current flows from the laser cathode 106 through the second current limiter circuit 134 to an electrical ground 112.

A second eye-safe limit register (register #2) 130 is a memory register which is programmed to hold a digital value. The digital value therein corresponds to a second current limit (i.e. a second maximum current) which is imposed by the second current limiter circuit 134. The digital value from register #2 130 is transformed into an analog control voltage by a second digital-to-analog (D/A) converter circuit 132. This analog control voltage is used to control the second current limiter circuit 134 so as to impose the second current limit. The current input via the return bond wire 136 from the laser cathode 106 to the second current limiter 134 does not exceed this second current limit. The second current limit may be set so as to be equal to the first current limit, or the second current limit may be set to a different current value as the first current limit.

The use of the two independent current limits for the current source and return, as described above, enables the apparatus to advantageously maintain an eye-safe current limit even during physical faults. Such physical faults include, for example, shorting of the diode laser's anode or cathode to supply voltage or ground. The two independent memory locations (120 and 130) and the two independent D/A converters (122 and 132) enable the apparatus to advantageously maintain an eye-safe current limit in the event of a memory corruption fault or a D/A converter fault.

The laser navigation sensor may be operated at a fixed temperature and supply voltage in order to calibrate the eye-safe current limit registers. The current limits may be set such that the output power of the laser diode is lower than the class 1 eye-safe limit, when installed with optics of the mouse device, by an appropriate margin of safety to account for output power variations with temperature, voltage and time.

In accordance with a preferred embodiment, the diode laser comprises a VCSEL emitting an 850 nanometers (nm) wavelength, and the eye-safe limit is set to approximately 0.7 milliwatts (mW). The VCSEL may typically have a slope efficiency of approximately 0.5 milliwatts/milliamperes (mW/mA) and a threshold of 4 to 5 mA.

It is further desirable to provide a current limit setting resolution which provides a sufficient resolution so as to minimize the margin between the eye-safe current for class 1 safety and the programmed current limit. In a preferred embodiment, the eye-safe limit registers and A/D converters may have at least 8-bit resolution to enable an approximately 15 microwatt output power resolution over a 0-8 mA current range.

The variation in the eye-safe current limits over operating temperature and supply voltages should be less than 3% in order to limit the power change to less than 100 microamperes. Most of the variation in drive current during operation is typically due to changes in supply voltage. An architecture that would reduce this sensitivity includes supply voltage monitors to correct for changes in supply voltage from the level at calibration. In addition, temperature sensors may be used to correct for temperature variations. Such an architecture is shown in FIG. 2.

Figure 2:
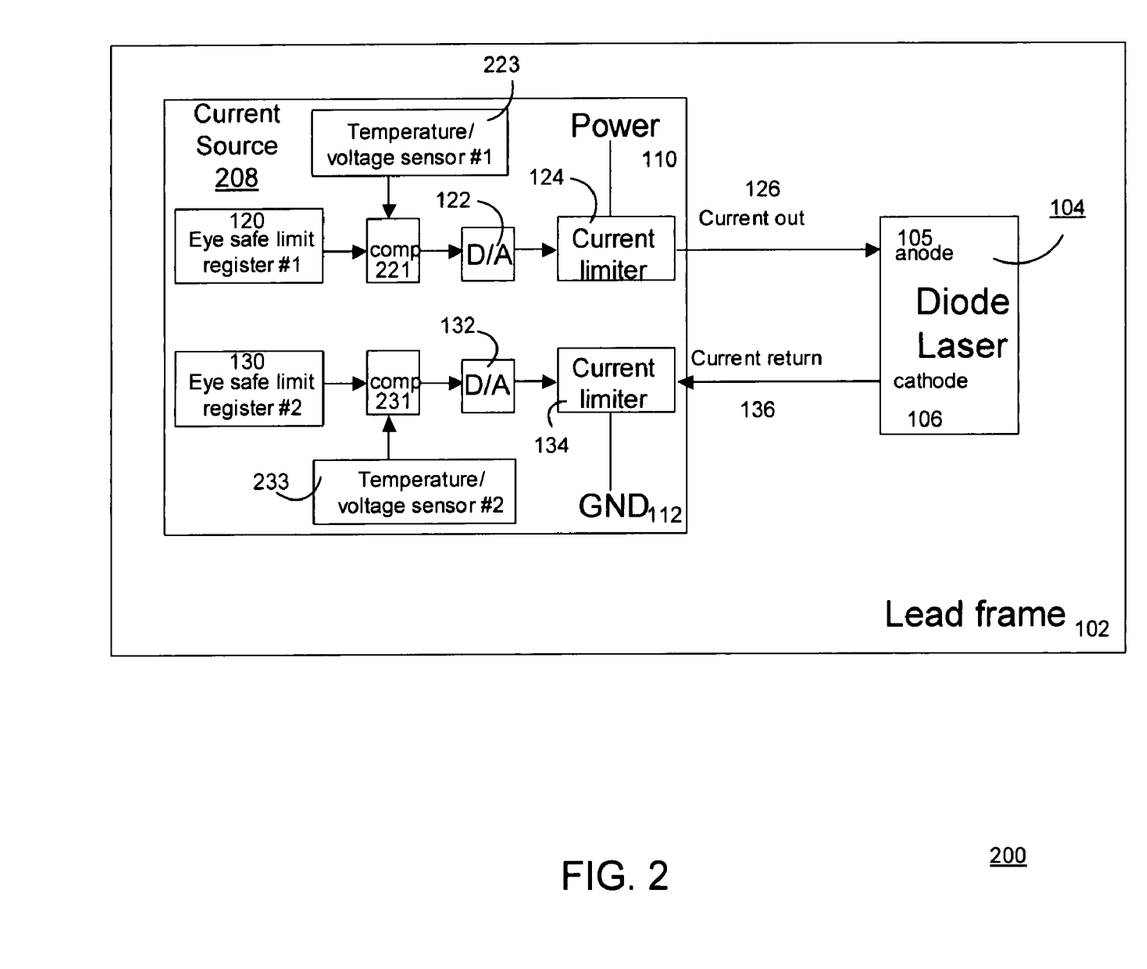
FIG. 2 is a schematic diagram showing an apparatus for fault-tolerant limitation of peak laser output power to maintain eye-safe operation of a laser navigation sensor in accordance with another embodiment of the invention.

FIG. 2 is a schematic diagram showing an apparatus 200 for fault-tolerant limitation of peak laser output power to maintain eye-safe operation of a laser navigation sensor in accordance with another embodiment of the invention. The current source 208 in this embodiment includes two independent sensor circuits (223 and 233). Each sensor circuit is configured to monitor supply voltage variations and/or sense temperature changes.

Each sensor circuit (223 and 233) has associated compensation circuitry (221 and 231, respectively). Per FIG. 2, each compensation circuit may be configured in between the associated register and the associated D/A converter for its path (either the current out path, or the current return path). As such, each compensation circuit may be configured to modify the digital data read from the associated register and to provide the compensated digital data to the associated D/A converter. Hence, the temperature/voltage sensors and their associated compensation circuitry are independent for each path (output path and return path) so as to maintain fault tolerance in the apparatus.

Fault-Tolerant Limitation of Average and Peak Optical Power

While the sensor circuits described above in relation to FIGS. 1 and 2 limit peak laser output power redundantly, they do not control time-averaged drive current in a fault-tolerant manner. Lacking this fault-tolerant control of average drive current, the peak drive current (which is fault-tolerant) must be used to satisfy certain eye-safety standards. Unfortunately, using peak current to satisfy eye-safety standards may result in a lower than optimal signal-to-noise ratio in the motion sensing signal due to a lower than optimal peak power.

The description below in relation to FIGS. 3-8 advantageously provides fault-tolerant control of both peak and time-averaged optical power for a laser navigation sensor. As a result, the laser emitter may use a lower average current and a higher peak current to satisfy certain safety standards. (For example, the IEC 60825-1 class 1 eye-safety requirements allow a laser to emit a higher peak power than average power.) Hence, the sensor circuitry described below provides means for increasing the peak current used while still meeting certain safety standards. Advantageously, the higher peak power may improve the signal-to-noise ratio of the motion sensing signal and result in improved sensor tracking performance.

Figure 3:
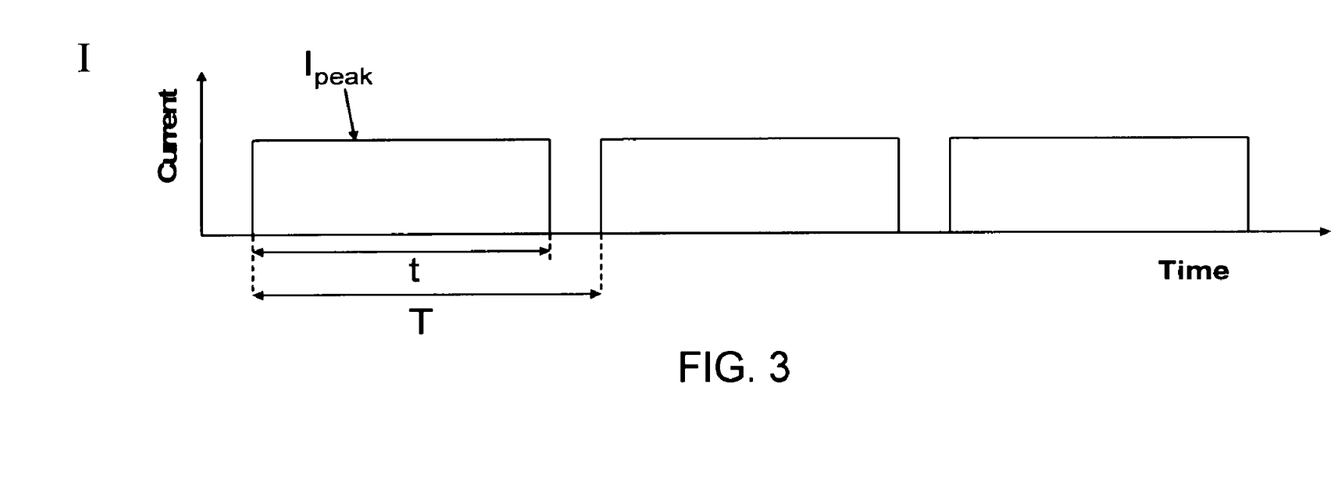
FIG. 3 is an example timing diagram depicting a drive current to a diode laser in a laser navigation sensor.

FIG. 3 is an example timing diagram depicting a drive current to a diode laser in a laser navigation sensor. The simple example waveform shown for the drive current I has a laser pulse of duration t at which the current is at a peak level of $I_{peak}$. The periodicity of the drive current waveform is T, such that the duty cycle is t divided by T. For such a pulse train of square wave pulses, the duty cycle may also be calculated as the average current divided by the peak current.

Figure 4:
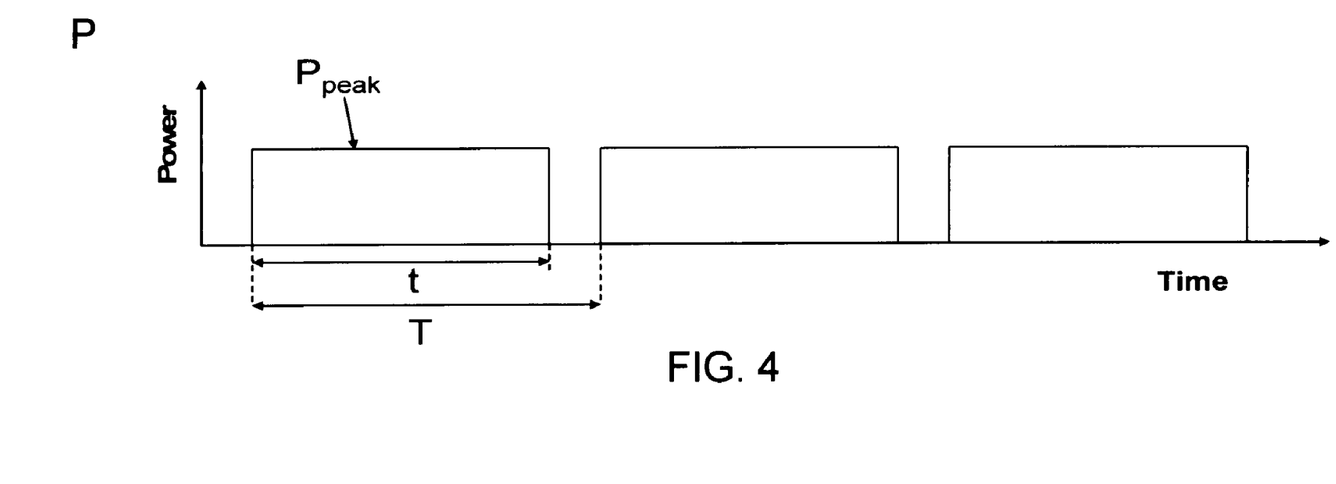
FIG. 4 is an example timing diagram depicting an output power from a diode laser in a laser navigation sensor.

FIG. 4 is an example timing diagram depicting an output power from a diode laser in a laser navigation sensor. Similarly to FIG. 3, the example waveform shown for the output power P has a laser pulse of duration t at which the current is at a peak level of $P_{peak}$. The periodicity of the output power waveform is T, such that the duty cycle is t divided by T. For such a pulse train of square wave pulses, the duty cycle may also be calculated as the average current divided by the peak current.

Figure 5:
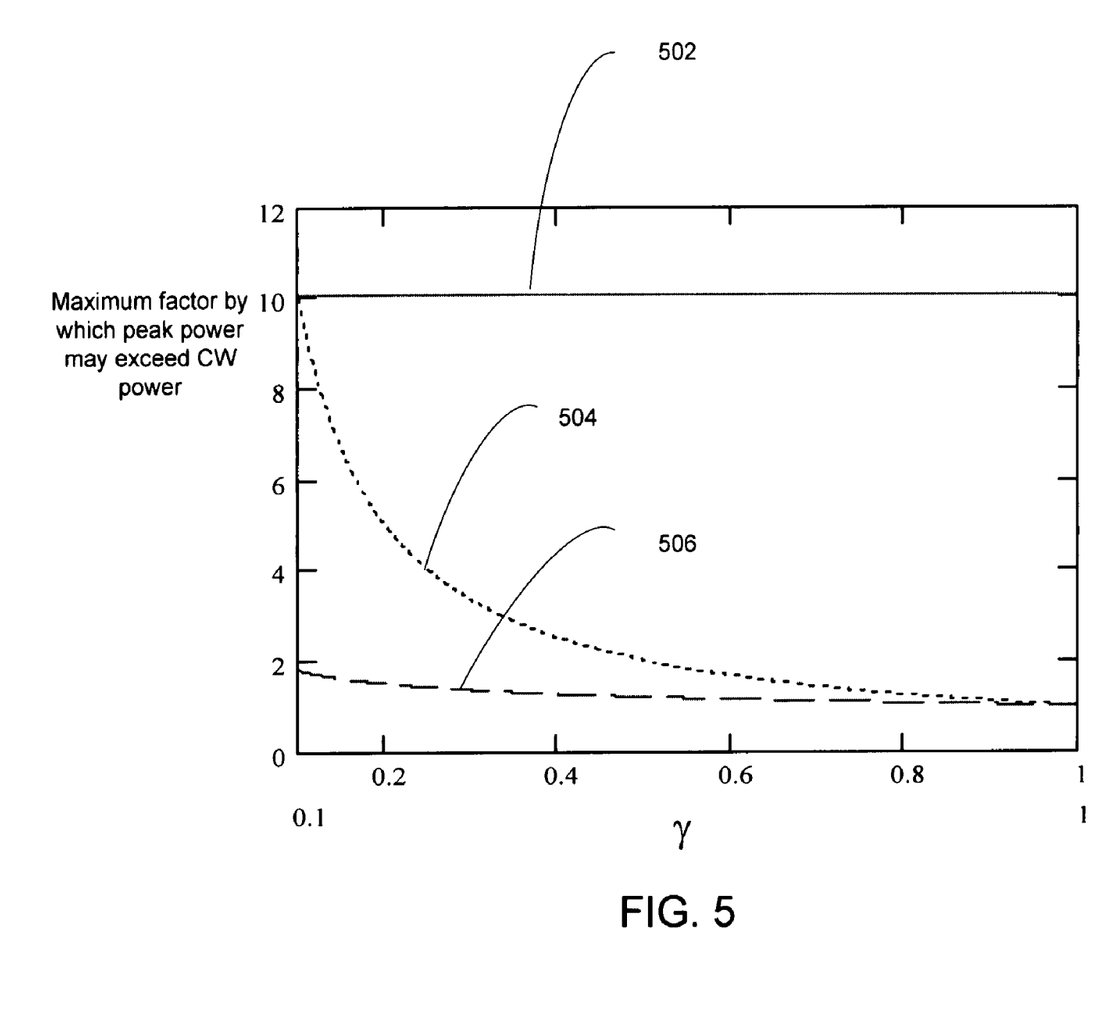
FIG. 5 is a plot showing a maximum factor by which the peak output power may exceed the CW output power under three constraining conditions.

FIG. 5 is a plot showing a maximum factor by which the peak output power may exceed the CW (continuous wave) output power under three constraining conditions. CW output power is a measure of average output power. These three constraining conditions are compatible, for example, with the IEC standards for class 1 eye-safety compliance. As a consumer product application, a laser optical mouse device must generally maintain a class 1 output power level over their specified operating conditions under any single fault condition.

If we consider the operating conditions of a typical optical navigation sensor, we can determine the maximum class 1 $P_{peak}$ as a function of pulse duration time, t, and modulation duty cycle, γ. The limitations shown in FIG. 5 are calculated considering a worst case pulse duration, t, of 1 millisecond (1 msec).

The first constraining condition is that the energy in any single pulse in the pulse train must be less than an accessible emission limit (AEL) for a single pulse. Without necessarily limiting the invention, applicants believe that calculations of the first constraining condition lead to the first limitation 502 shown in FIG. 5. As seen, under the first limitation 502, peak power may exceed CW power by a constant factor of about 10 over the range of duty cycles from 0.1 to 1.0.

The second constraining condition is that the average power of the pulse train of duration T must be less than the average pulse energy accessible emission limit (average pulse energy AEL) for a pulse of duration T. Without necessarily limiting the invention, applicants believe that calculations of the second constraining condition lead to the second limitation 504 shown in FIG. 5. As seen, under the second limitation 504, peak power may exceed CW power by a factor which is at about 10 at a duty cycle of 0.1 and decreases to about 1.0 at a duty cycle of 1.0.

Figure 6:
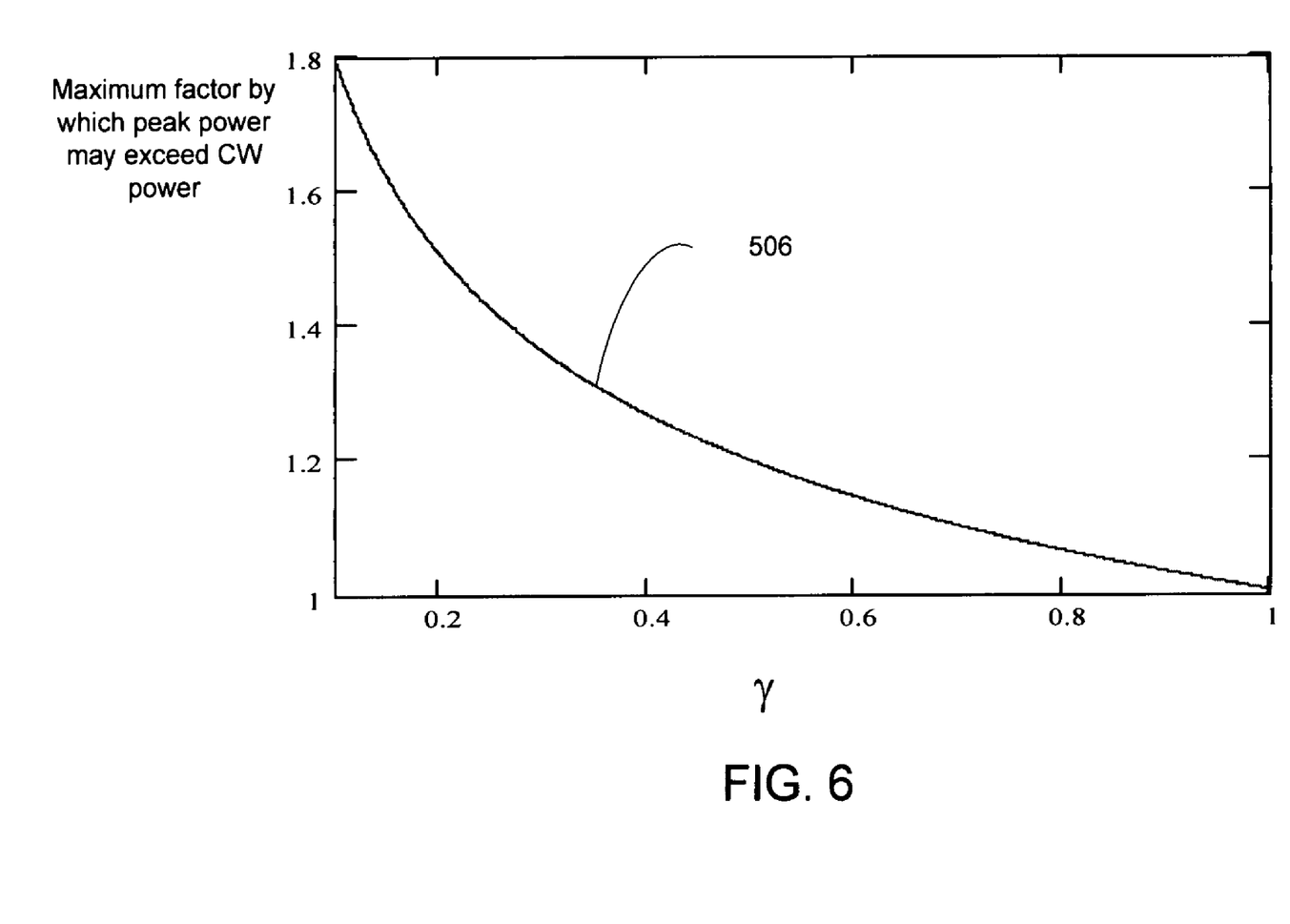
FIG. 6 is an expanded plot showing a maximum factor by which the peak output power may exceed the CW output power under the third limiting condition from FIG. 5.

The third constraining condition is that the average pulse energy from the pulse train must be less than the single pulse AEL multiplied by N raised to the −0.25 power, where N is the number of pulses during a ten second interval (for 400-1400 nm, minimum angle subtended by the source). Without necessarily limiting the invention, applicants believe that calculations of the third constraining condition lead to the third limitation 506 shown in FIG. 5. FIG. 6 is an expanded plot showing a maximum factor by which the peak output power may exceed the CW output power under the third limitation 506. As seen, under the third limitation 506, peak power may exceed CW power by a factor which is at about 1.8 at a duty cycle of 0.1 and decreases to about 1.0 at a duty cycle of 1.0.

Since the third curve 506 is lower than the other two curves (502 and 504) over the range of duty cycles, we conclude that, at least in this case, the third constraining limitation 506 is the most restrictive of the three constraining limitations.

In addition, applicants have also determined that the third limitation 506 is independent or relatively independent of the pulse duration, t, for pulses of duration longer than 18 microseconds. For pulses of duration shorter than 18 microseconds, the class 1 peak output power AEL is higher than for pulses longer than 18 microseconds for all duty cycles. We can therefore increase the peak output power while maintaining class 1 operation by implementing a circuit that limits the peak power for a given laser duty cycle according to the curve 506 shown in FIG. 6.

Circuitry for Fault-Tolerant Limitation of Average and Peak Optical Power

Figure 7:
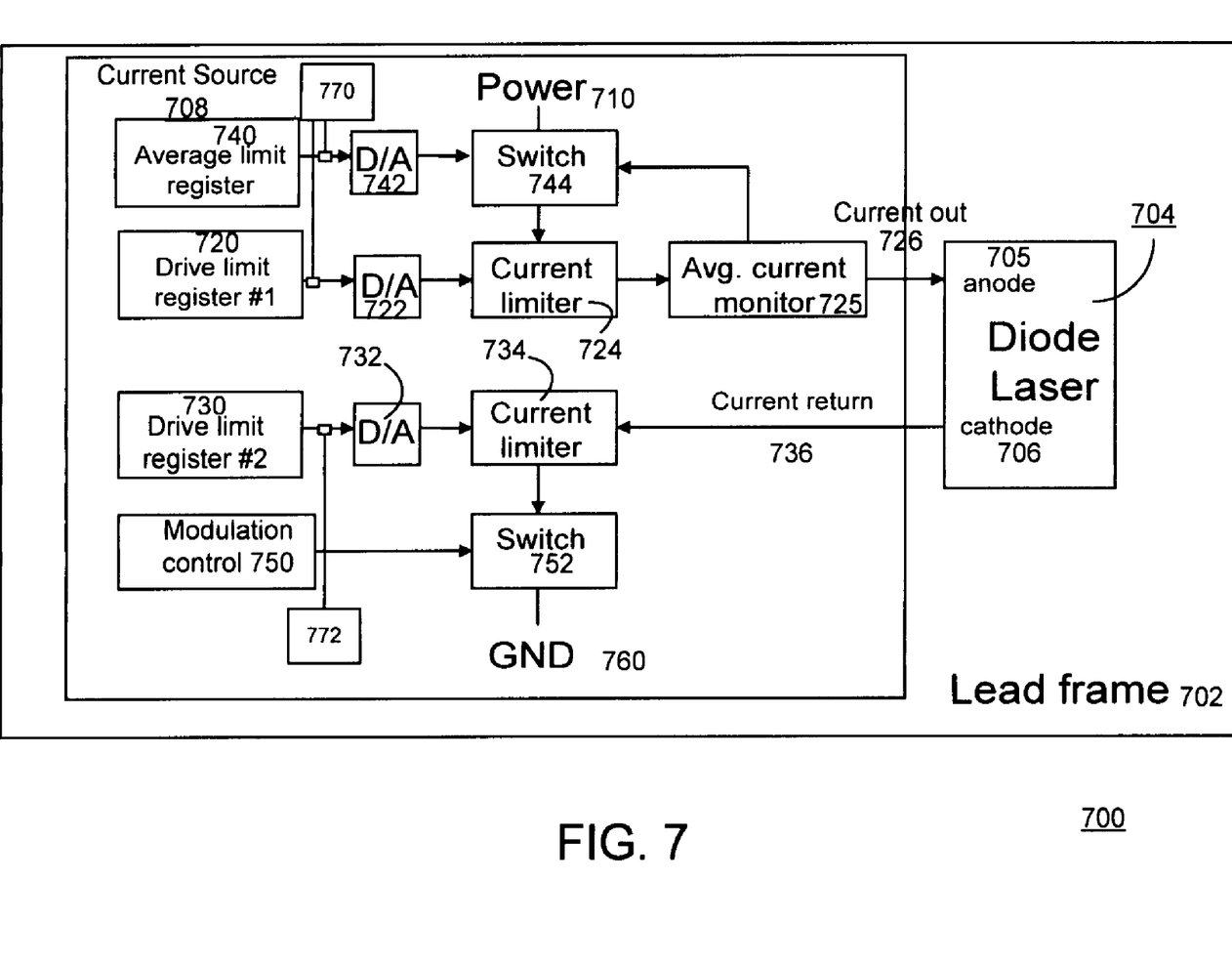
FIG. 7 is a schematic diagram showing an apparatus for fault-tolerant limitation of both average and peak laser output power to maintain eye-safe operation of a laser navigation sensor in accordance with an embodiment of the invention.

FIG. 7 is a schematic diagram showing an apparatus 700 for fault-tolerant limitation of average and peak laser output power to maintain eye-safe operation of a laser navigation sensor in accordance with an embodiment of the invention. The apparatus 700 may include a lead frame 702. The lead frame may contain a diode laser 704 and a current source 708. The current source 708 may be implemented as an integrated circuit on a silicon die. The diode laser 704 may comprise, for example, a vertical cavity surface emitting laser (VCSEL). Bond wires may be configured so as to attach to the diode laser anode 705 for the current output connection 726 and cathode 706 for the current return connection 736.

Peak Current Limitation Circuitry

In accordance with an embodiment of the invention, the current source 708 may be configured with two independent means for limiting the peak electrical current flowing out of the current source and back into the current source. These two independent means include two independent peak current limiter circuits 724 and 734.

The first peak current limiter circuit 724 is configured to limit the peak electrical current flowing out of the current source 708. Electrical current flows from a power source 710 (through the switch 744) to the first peak current limiter circuit 724 (through the average current monitor 725) and to the laser anode 705. A first eye-safe limit register (drive limit register #1) 720 is a memory register which is programmed to hold a digital value. The digital value therein corresponds to a first peak current limit (i.e. a first maximum current limit) which is imposed by the first current limiter circuit 724. The digital value from the drive limit register #1 720 is transformed into an analog control voltage by a first digital-to-analog (D/A) converter circuit 722. This analog control voltage is used to control the first peak current limiter circuit 724 so as to impose the first peak current limit. The current output from the peak current limiter circuit 724 to the anode 705 of the diode laser 704 does not exceed this first peak current limit.

The second peak current limiter circuit 734 is configured to limit the peak electrical current returning to the current source 708. Electrical current flows from the laser cathode 706 through the second peak current limiter circuit 734 (and through the switch 752) to an electrical ground (GND) 760. A second peak current limit register (drive limit register #2) 730 is a memory register which is programmed to hold a digital value. The digital value therein corresponds to a second peak current limit (i.e. a second maximum current limit) which is imposed by the second current limiter circuit 734. The digital value from the drive limit register #2 730 is transformed into an analog control voltage by a second digital-to-analog (D/A) converter circuit 732. This analog control voltage is used to control the second peak current limiter circuit 734 so as to impose the second (redundant) peak current limit. The current input via the current return 736 from the laser cathode 706 to the second peak current limiter 734 does not exceed this second peak current limit. The second peak current limit may be set so as to be equal to the first peak current limit. Alternatively, the second peak current limit may be set to a different current value as the first peak current limit.

The use of the two independent peak current limits for the current source and return, as described above, enables the apparatus to advantageously maintain an eye-safe peak current even during a single physical fault. Such physical faults include, for example, shorting of the diode laser's anode or cathode to supply voltage or ground. The two independent memory locations (720 and 730) and the two independent D/A converters (722 and 732) enable the apparatus to advantageously maintain an eye-safe current limit in the event of a memory corruption fault or a D/A converter fault.

Time-Averaged Current Limitation Circuitry

In accordance with an embodiment of the invention, the current source 708 may also be configured with two independent means for limiting the time-averaged electrical current flowing out of the current source and back into the current source. These two independent means include two independent switch circuits 744 and 752 and their respective control circuitry. The control circuitry is configured independently so that they are tolerant to at least single faults in memory values and circuit performance.

The first switch circuit 744 receives input from the average limit register 740 (via third D/A converter circuitry 742) and from the average current monitor 725. The average limit register 740 is a memory register which is programmed to hold a digital value. The digital value therein corresponds to a time-averaged current limit (to be imposed on the current out 726 going to the anode 706 of the diode laser 704). For example, the digital value stored in the average limit register 740 may be set to a value that is within the class 1 limit for the highest duty cycle and highest peak current at which the modulation control circuitry 750 is programmed to operate. The digital value from the average limit register 740 is transformed or converted into a first analog control voltage by the third D/A converter circuitry 742. This first analog control voltage is a first input signal into the first switch circuit 744.

The second input signal into the first switch circuit 744 is received from the average current monitor circuit 725. The average current monitor circuit 725 provides a second analog control voltage which is indicative of the time-averaged electrical current flowing to the anode 705 of the diode laser 704.

The first switch circuit 744 includes comparative circuitry to compare the first and second analog control voltages. If the comparison indicates that the average current (represented by the second control voltage) exceeds the time-averaged current limit (represented by the first control voltage), then the first switch circuitry 744 is "tripped" such that it switches off (i.e. makes an open circuit to stop) the current flowing from the power source 710. Hence, in this case, the current out 726 to the anode 705 is shut off. Otherwise, if the comparison indicates that the average current does not exceed the time-averaged current limit, then the first switch circuitry 744 allows the current to continue to flow from the power source 710. Hence, in this case, the current out 726 to the anode 705 continues to flow.

Thus, the first switch circuit 744 functions as a first mechanism for limiting average current flow through the diode laser 704. The second switch circuit 752 provides a second mechanism for limiting average current flow through the diode laser 704.

The second switch circuit 752 is controlled by modulation control circuitry 750. The modulation control circuitry 750 includes logic, control registers, and circuitry to control the second switch circuit 752. For example, the modulation control circuitry 750 may provide a square wave control signal with a particular duty cycle to the second switch circuit 752. The maximum current allowed through the second current limiter circuit 734 and the duty cycle imposed by the second switch circuit 752 combine to form the second mechanism for limiting average current flow through the diode laser 704. In particular, the average current flow allowed by the second mechanism is not to exceed the maximum current allowed through the second current limiter circuit 734 multiplied by the duty cycle imposed by the second switch circuit 752.

Optional sensor and compensation circuitry may also be included. Preferably, at least two independent sensor and compensation circuits 770 and 772 are included. Each sensor circuit is configured to monitor supply voltage variations and/or sense temperature changes and has associated compensation circuitry in between the associated registry and the associated D/A converter for its path(s). The compensation circuitry may be configured to modify the digital data read from the associated register and to provide the compensated digital data to the associated D/A converter.

In accordance with an embodiment of the invention, as shown in FIG. 7, the data output by both drive limit register #1 720 and the average limit register 740 may be compensated using voltage variations and/or temperature changes as measured from a first sensor (see 770). Meanwhile, the data output by both drive limit register #2 730 may be compensated using voltage variations and/or temperature changes as measured from a second sensor (see 772), where the second sensor is independent of the first sensor.

Figure 8:
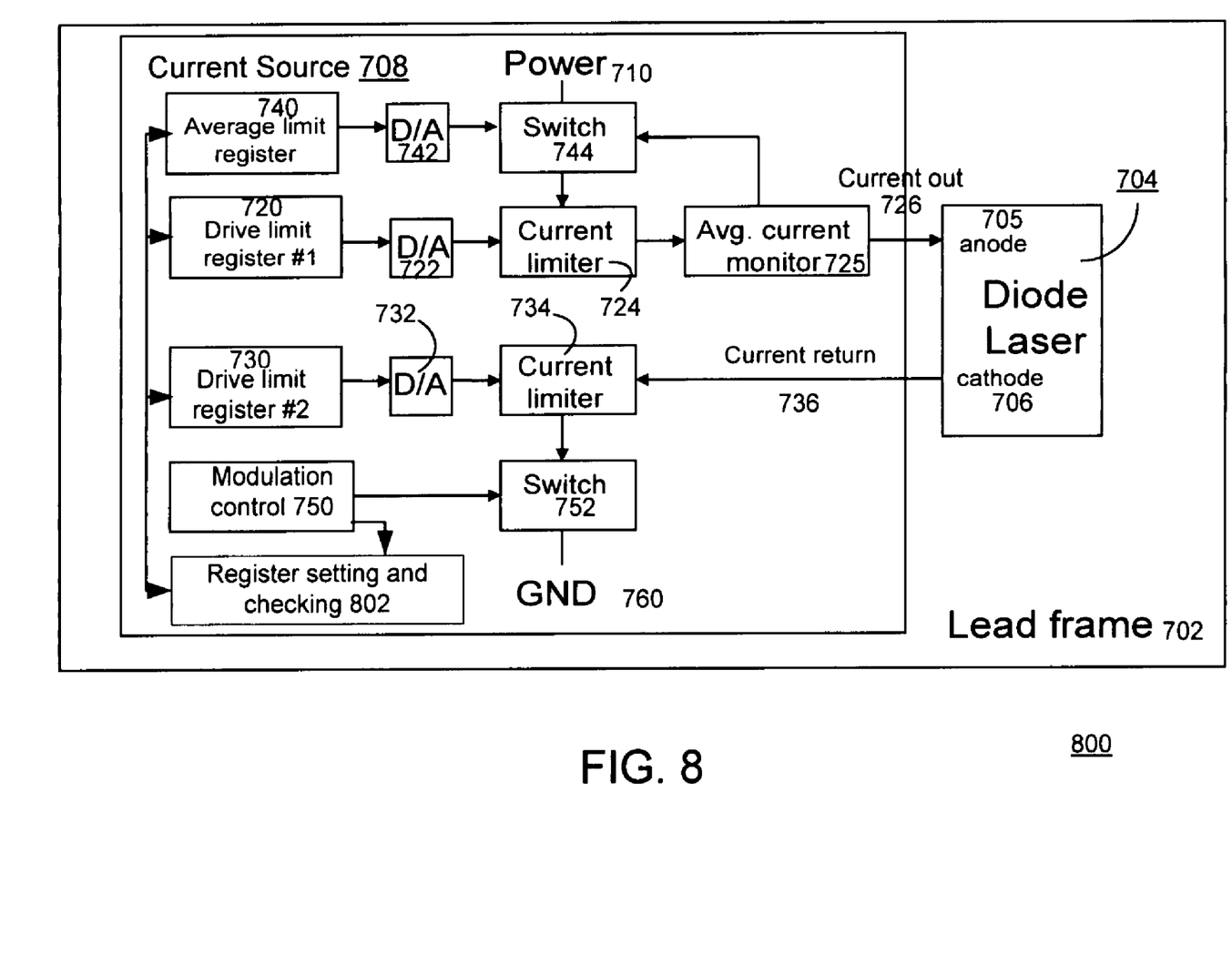
FIG. 8 is a schematic diagram showing an apparatus for dynamically-controlled fault-tolerant limitation of both average and peak laser output power to maintain eye-safe operation of a laser navigation sensor in accordance with an embodiment of the invention.

Circuitry for Dynamically-Controlled Fault-Tolerant Limitation of Average and Peak Optical Power FIG. 8 is a schematic diagram showing an apparatus 800 for dynamically-controlled fault-tolerant limitation of both average and peak laser output power to maintain eye-safe operation of a laser navigation sensor in accordance with an embodiment of the invention. The apparatus 800 has a more flexible architecture which allows the average current limit and peak current limit to be modified dynamically depending upon the operating duty cycle over time.

The register setting and checking circuitry 802 in FIG. 8 may be configured to receive the switch control signal (i.e. the square wave control signal) output by the modulation control circuitry 750. From that, the register setting and checking circuitry 802 may determine the duty cycle at that particular time (i.e. the duty cycle as it dynamically changes over time).

Having determined the time-dependent duty cycle, the register setting and checking circuitry 802 is then able to dynamically modify the register values for the drive limit register #1 720, the drive limit register #2 730, and the average limit register 740. To provide fault-tolerance, the register setting and checking circuitry 802 should be fault tolerant and include circuitry to independently check that the proper values have been calculated and loaded into the three registers.

Circuitry for Modifying Peak and/or Average Current Limits Based Upon Temperature and/or Supply Voltage Variations The fault-tolerant apparatus described above may also have additional circuitry for modifying the peak and/or average current limits based upon temperature and/or supply voltage variations to maintain eye-safe operation of a laser navigation sensor.

For example, the additional circuitry may be implemented with compensation circuitry between each register and its associated D/A converter circuit in a similar manner as shown in FIG. 2. The compensation circuitry for each register may be configured to modify the digital data read from the register and provide the compensated digital data to the associated D/A converter. The magnitude and direction of said modification would depend on the signal received from a temperature and/or voltage sensor unit associated with that compensation circuitry. The sensor unit and compensation circuitry for each register should be independent so as to maintains single-fault tolerance of the apparatus.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. An apparatus comprising:
   a diode laser;
   a current source interconnected with the diode laser;
   a first limiting circuit in the current source configured to monitor and limit peak current flowing to an anode connection of the diode laser;
   a second limiting circuit in the current source configured to monitor and limit peak current flowing from a cathode connection of the diode laser, wherein the second limiting circuit is independent from the first limiting circuit;
   a third limiting circuit in the current source configured to monitor and limit average current flowing through the diode laser; and
   a fourth limiting circuit in the current source configured to monitor and limit average current flowing through the diode laser, wherein the fourth limiting circuit is independent from the third limiting circuit.

2. The apparatus of claim 1, further comprising:
   a first register configured to hold peak current limit data to be applied by the first limiting circuit to configure the first limiting circuit to limit peak current flowing to the anode connection to maintain eye-safe operation;
   a second register configured to hold peak current limit data to be applied by the second limiting circuit to configure the second limiting circuit to limit peak current flowing from the cathode connection to maintain eye-safe operation; and
   a third register being configured to hold average current limit data to be applied by the third limiting circuit.

3. The apparatus of claim 2, wherein the first limiting circuit comprises a first current limiter circuit, the second limiting circuit comprises a second current limiter circuit, and the third limiting circuit comprises a first switch circuit.

4. The apparatus of claim 3, wherein the first current limiter circuit receives a first analog control signal from a first digital-to-analog converter coupled to the first register, and the second current limiter circuit receives a second analog control signal from a second digital-to-analog converter coupled to the second register.

5. The apparatus of claim 4, further comprising:
   an average current monitor circuit coupled in between the first current limiter circuit and the laser diode, wherein the first switch circuit is controlled by two control signals, the two control signals being a third analog control signal from a third digital-to-analog converter coupled to the third register and a fourth analog control signal received from the average current monitor circuit.

6. The apparatus of claim 5, wherein the fourth circuit includes modulation control circuitry and a second switch circuit which is controlled by said modulation control circuitry.

7. The apparatus of claim 6, further comprising register setting and checking circuitry that is configured to dynamically modify and verify the data in said three registers based on a time-dependent duty cycle of a control signal from the modulation control circuitry.

8. The apparatus of claim 2, further comprising:
   a first temperature sensor configured to monitor changes in operating temperature;
   a first compensation circuit controlled by an output signal from the first temperature sensor and configured to modify the peak current limit data read from the first register and to modify the average current limit data read from the third register;
   a second temperature sensor configured to monitor changes in operating temperature; and
   a second compensation circuit controlled by an output signal from the second temperature sensor and configured to modify the peak current limit data read from the second register.

9. The apparatus of claim 2, further comprising:
   a first supply voltage sensor configured to monitor changes in power supply voltage;
   a first compensation circuit controlled by an output signal from the first supply voltage sensor and configured to modify the peak current limit data read from the first register and to modify the average current limit data read from the third register;
   a second supply voltage sensor configured to monitor changes in the power supply voltage; and
   a second compensation circuit controlled by an output signal from the second supply voltage sensor and configured to modify the peak current limit data read from the second register.

10. The apparatus of claim 1, wherein the current source is manufactured on a single silicon die.

11. A method comprising:
    emitting laser light from a laser device;
    providing current to and receiving current from the laser device;
    monitoring and limiting peak current flowing to an anode connection of the laser device;
    monitoring and limiting peak current flowing from a cathode connection of the laser device in an independent manner from said limiting of peak current flowing to the anode connection;
    monitoring and limiting time-averaged current flowing to the anode connection of the laser device; and
    monitoring and limiting time-averaged current flowing from the cathode connection of the laser device in an independent manner from said limiting of time averaged current flowing to the anode connection.

12. The method of claim 11, further comprising:
    holding peak current limit data in a first register to configure a first current limiter to limit the peak current flowing to the anode connection to maintain eye-safe operation; and
    holding peak current limit data in a second register to configure a second current limiter to limit the peak current flowing from the cathode connection to maintain eye-safe operation; and holding average current limit data in a third register to be applied by a first switch to limit the time-averaged current flowing to the anode connection.

13. The method of claim 12, further comprising converting the data from the registers to analog signals.

14. The method of claim 13, further comprising:
controlling the first switch circuit by comparing two control signals, the two control signals being an analog control signal derived from the data in the third register and another analog control signal received from an average current monitor circuit.

15. The method of claim 14, dynamically modifying and verifying the data in said three registers based on a time-dependent duty cycle of a control signal from modulation control circuitry.

16. The method of claim 12, further comprising:
monitoring changes in operating temperature by a first temperature sensor;
modifying the peak current limit data read from the first register and the average current limit data read from the third register based on an output signal from the first temperature sensor;
monitoring changes in operating temperature by a second temperature sensor; and
modifying the peak current limit data read from the second register based on an output signal from the second temperature sensor.

17. The method of claim 12, further comprising:
monitoring changes in supply voltage by a first supply voltage sensor;
modifying the peak current limit data read from the first register and the average current limit data read from the third register based on an output signal from the first supply voltage sensor;
monitoring changes in supply voltage by a second supply voltage sensor; and
modifying the peak current limit data read from the second register based on an output signal from the second supply voltage sensor.

18. An integrated circuit comprising:
a first limiting circuit in the current source configured to monitor and limit average current flowing through the diode laser; and
a second limiting circuit in the current source configured to monitor and limit average current flowing through the diode laser, wherein the second limiting circuit is independent from the first limiting circuit.

19. The integrated circuit of claim 18, wherein the first limiting circuit comprises a first switch, and further comprising a third register configured to hold average current limit data to be applied by the first switch.

20. The integrated circuit of claim 19, wherein the second limiting circuit comprises a second switch, and further comprising modulation control circuitry which controls said second switch.

* * * * *